United States Patent
Cusinato et al.

(10) Patent No.: US 6,486,736 B2
(45) Date of Patent: Nov. 26, 2002

(54) CLASS AB SINGLE-RANGE ADVANCED OPERATIONAL AMPLIFIER

(75) Inventors: Paolo Cusinato, Sestri Levante (IT); Andrea Baschirotto, Tortona (IT); Vittorio Colonna, Landriano (IT); Gabriele Gandolfi, Siziano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/802,583

(22) Filed: Mar. 8, 2001

(65) Prior Publication Data

US 2001/0020869 A1 Sep. 13, 2001

(30) Foreign Application Priority Data

Mar. 9, 2000 (IT) .................................. MI2000A000468

(51) Int. Cl.[7] ................................................. H03F 3/45
(52) U.S. Cl. ...................................... 330/255; 330/292
(58) Field of Search ............................... 330/255; 4/292

(56) References Cited

U.S. PATENT DOCUMENTS 4,342,003 A * 7/1982 Saari ........................... 330/253

OTHER PUBLICATIONS

Castello et al (Castello) "A High–Performance Micropower Switched–Capacitor Filter" IEEE Journal of Solid–State Circuits, vol. SC–20, No. 6, Dec. 1985 pp 1122–1132.*

* cited by examiner

Primary Examiner—Michael B Shingleton
(74) Attorney, Agent, or Firm—Lisa K. Jorgenson; E. Russell Tarleton; Seed IP Law Group PLLC (57) ABSTRACT

A class AB single-stage operational amplifier having input decoupler stages for voltage signals, a voltage repeater stage, biasing transistors and bias current generators for the input decoupler stages, and capacitors placed between the input decoupler stages and the voltage repeater stage so as to increase the phase margin.

20 Claims, 5 Drawing Sheets

CLASS AB SINGLE-RANGE ADVANCED OPERATIONAL AMPLIFIER

TECHNICAL FIELD

The present invention refers to a class AB single-stage advanced operational amplifier.

BACKGROUND OF THE INVENTION

The operating class of the operational amplifiers is defined according to the polarization of the active elements that supply power to the load and can be divided, among the various ones existing, into class A, in which the active elements always operate in a conduction zone and are polarized at about the center of it (for bipolar signals), class B, in which the active elements are polarized at the locking limit of the conduction zone, class AB, in which the active elements are weakly polarized within the conduction zone, and in class C, in which the active elements operate far from the conduction zone.

In particular, class AB has the characteristics of having reduced distortion for small signals, good operating efficiency, zero stand-by power and a low dissipation of the active elements, but with circuit architecture that provides for an input stage of the voltage decoupler type (source-follower for MOS technology, or emitter-follower for bipolar technology); it also has the problem of the doublet pole-zero introduced by such a stage that limits the band width available and considerably degrades the phase margin of the amplifier itself bringing it close to instability.

Class AB operational amplifiers are known that comprise an input stage of the voltage decoupler type (source follower for MOS technology, emitter follower for bipolar technology) and means for polarizing the amplifier itself, such as to introduce low frequency singularity capable of degrading the phase margin.

SUMMARY OF THE INVENTION

In view of the state of the technique described, the disclosed embodiment of the present invention provides an operational amplifier capable of reducing the effect of the doublet pole-zero introduced by the input stage.

A class AB single-stage operational amplifier is disclosed that includes a decoupler input stage for voltage signals, a voltage repeater stage, biasing means and means for the generation of bias current of the decoupler input stage, and a capacitive structure placed between the voltage decoupler stage and the voltage repeater stage so that the phase margin is increased.

In accordance with the embodiment of the present invention disclosed herein, a compensation technique can be made that is capable of reducing the effect of the pole-zero, thus increasing the phase margin of the operational amplifier, supplying a wider band width, and increasing, therefore, the stability of the system.

BRIEF DESCRIPTION OF THE DRAWINGS

The characteristics and the advantages of the embodiments of the present invention will be better understood from the following detailed description of an embodiment thereof, illustrated as non-limiting example in the enclosed drawings, in which.

DETAILED DESCRIPTION OF THE INVENTION

Figure 1:
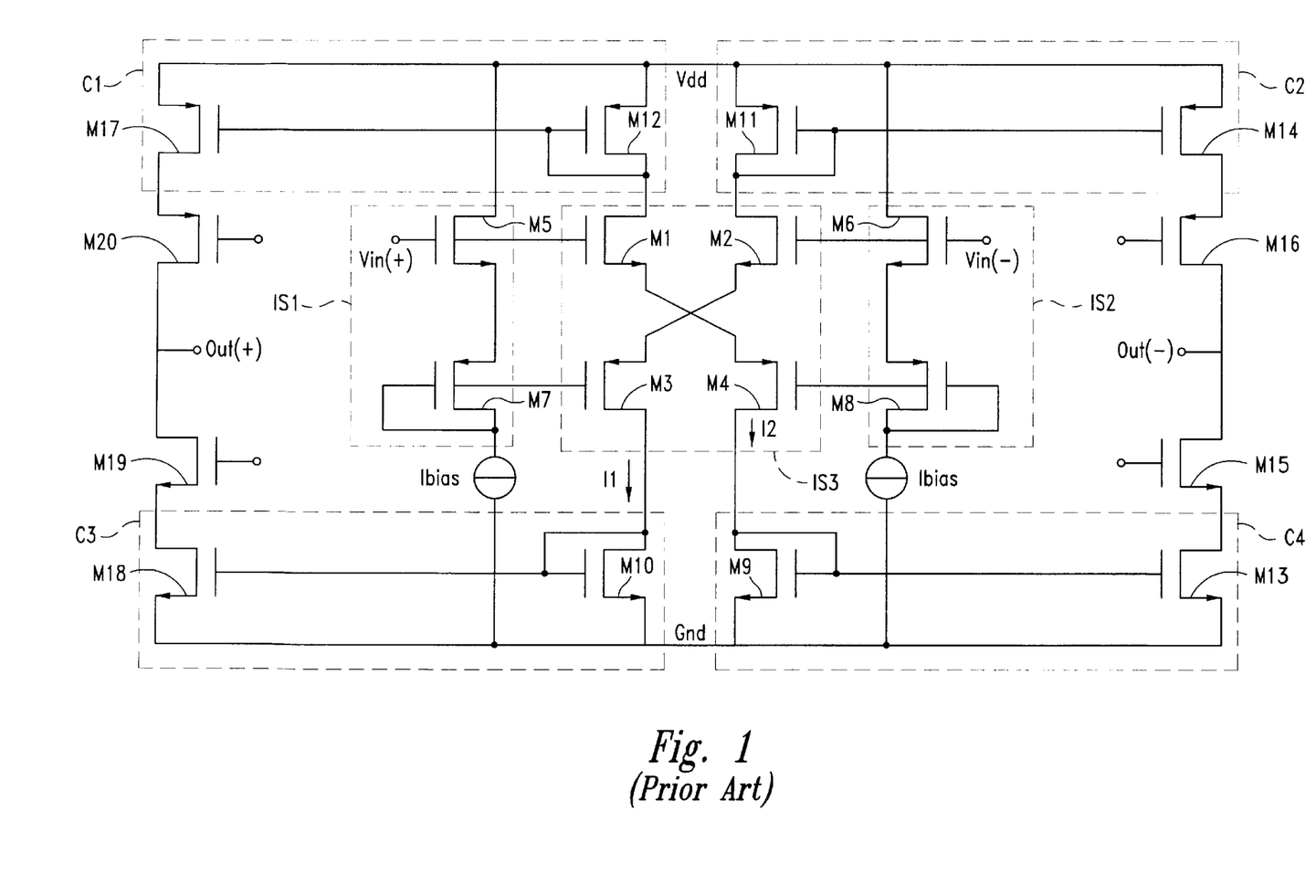
FIG. 1 shows a simplified diagram of a single-stage class AB amplifier according to the known technique.

A simplified diagram of a single-stage class AB amplifier according to the known technique is shown in FIG. 1.

The circuit illustrated in FIG. 1 is a single-stage class AB operational amplifier proposed by Castello and Gray in "A High-Performance Micropower Switched-Capacitor Filter" edited by IEEE Journal of Solid-State Circuits, Vol. SC-20, No.6, December 1995.

The circuit proposed in FIG. 1 presents a first input decoupler stage IS1, consisting of an NMOS transistor M5 that acts as input terminal for a positive differential signal Vin(+) and as PMOS transdiode load M7, of a second input decoupler stage IS2, consisting of an NMOS transistor M6 that acts as input terminal for a negative differential signal Vin(−) and as PMOS transdiode load M8, of an input stage with a shifted level, also called a voltage repeater stage or "level-shifted stage input", IS3, consisting of NMOS transistors M1 and M2 and of PMOS transistors M3 and M4 in which M1 has the source electrode connected with the source electrode of M4, and M2 has the source electrode connected with the source electrode of M3.

The first input decoupler stage IS1 is directly connected to supply Vdd and has a voltage generator Ibias as polarization element, with one terminal grounded (Gnd), similarly for the second input decoupler stage IS2.

The input stage IS3, instead, for the branch connected with the input terminal of the positive differential voltage signal Vin(+) provides loads C1 and C3 in a mirror configuration, where C1 comprises a couple of PMOS transistors M17 and M12 with the latter in transdiode configuration, and where C3 comprises NMOS transistors M18 and M10, with the latter in mirror configuration and for the branch connected with the input terminal of the negative differential voltage signal Vin(−) provides a couple of loads C2 and C4 in mirror configuration, where C2 comprises PMOS transistors M14 and M11 with the latter in transdiode configuration, and where C4 comprises NMOS transistors M13 and M9 with the latter in mirror configuration. where C2 comprises PMOS transistors M14 and M11 with the latter in transdiode configuration, and where C4 comprises NMOS transistors M13 and M9 with the latter in mirror configuration.

In addition, biasing means in the form of PMOS transistors M16 and M20 suitable for biasing the upper level of the circuit and NMOS transistors M15 and M19 for the polarization of the lower level of the circuit can be noted, and between said transistor M19 and M20 a positive differential output terminal Out(+) and between said transistors M15 and M16 a negative differential output terminal Out(−) can be seen.

In the presence of, for example, a differential input signal equal to zero, that is Vin(+)=Vin(−)=0, the two bias voltage generators Ibias only define the level of the quiescent current of the input decoupler stages and, in addition, if we assume for simplicity that the four NMOS type input transistors M1, M2, M5 and M6 have the same ratio of form, that is that they have the same W/L, and similarly for the four PMOS type input transistors M3, M4, M7 and M8, we have a current I1, present in the branch connected with the terminal of the positive input differential signal, being equal to a current I2, present in the branch connected with the terminal of the negative differential input signal, both these currents coincide with the current of the couple of polarization generators Ibias, that is I1=I2=Ibias.

Moreover, if we assume that the error in mirroring of the loads C1, C2, C3 and C4 is equal to one, that is currents I1 and I2 are re-proposed in an ideal manner for the mirror, without losses caused by circuit elements, we have also that the output current present at the terminals Out(+) and Out(−), is equal to the bias current Ibias.

This means that the consumption of power in the quiescent phase, ideally null, in the circuit proposed in FIG. 1 is controlled by how much the input stage current generators are "similar", that is if the two generators deliver the same current under all operating conditions.

Concerning the dynamic behavior of the circuit, in the event, for example, that all of the differential signal is applied to the input terminal Vin(+), the current I1 goes to zero and likewise half of the circuit devices go into locking. Vice versa, the current I2 reaches its maximum value, which, in first approximation, is only limited by the voltage applied in input. Assuming we continue having an ideal mirror factor, we derive that the output current is equal to the current I2 in such a manner that it is possible to rapidly load and unload the load capacities of the operational amplifier.

The circuit diagram shown in FIG. 1 guarantees good rejection of the noise of the high frequency supply voltage and a good slew-rate, but when greater band widths are requested, the specification cannot be met as the doublet pole zero intervenes introduced by the first and second input stages IS1 and/or IS2. This doublet degrades the phase margin of the operational amplifier to a very low value, such as to bring the amplifier itself very close to instability.

For a detailed description of the operation of such a circuit see the previously described note.

Figure 2:
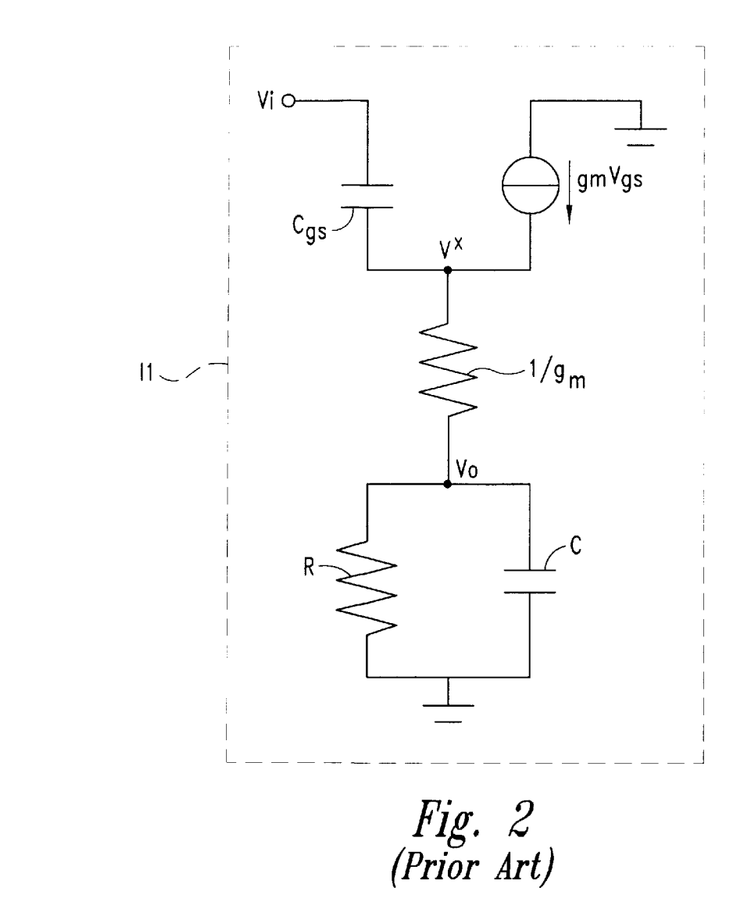
FIG. 2 shows an equivalent circuit diagram of a detail in FIG. 1.

An equivalent circuit diagram of a detail of FIG. 1 is shown in FIG. 2.

According to what is illustrated in FIG. 2, it can be noted that the blocks IS1 or IS2 of the circuit in FIG. 1 is represented with the equivalent circuit model for small signals, well known to a technician in the sector. It can be noted, for example, that the load of the transistor M5, that is the transdiode M7, is represented by the series of the inverse transconductance of the transdiode M7 itself, that is $1/gm1$, with parallel of a resistor R0 and a capacity C0'. Similarly for the transistor M6.

As previously described, the input stage IS1 or IS2 or both, which represent a configuration of the source-follower type, introduce a doublet pole-zero such as to considerably degrade the phase margin with the risk of making the amplifier unstable.

To calculate the frequency of the pole and of the zero of the circuit diagram of FIG. 2, the impedance that persists between the circuit node V* and the ground has to be calculated as:

$$1/gm1 * [R0/(1+s*R0*C0')]$$

In addition, as "gm1*R0" is much greater than 1, that is that the value of "1/gm1" is negligible compared to the resistive load of the input stage, the previous expression can be simplified as:

$$R0/(1+s*R0*C0')$$

Successively the transfer function between the input of the operational amplifier and the output of the source-follower type input stage IS1 or IS2 or both has to be calculated, that is A(s)=Vout(s)/Vin(s). To obtain this the first law of Kirchoff is applied to the output terminal Vout(s) of the operational amplifier or to the source terminal of the input transistor M5 or M6 or both continuing to assume negligible the value 1/gm1 of the transdiode M7 or M8 or both and we obtain:

$$(Vin-Vout)s\ Cgs+gm*vgs=Vout*(1+s*R0*C0')/R0$$

where "Cgs" represents the capacity between the gate terminal and the source terminal of the transistor M5 or M6 or both, and "gm" represents the transconductance of the same transistors.

From the circuit it can be deduced that Vin−Vout=vgs which gives rise to an expression of the type:

$$Vout/Vin=gm*R0/(1+gm*R0)*(1+s*Cgs/gm)/[1+s*R0*(Cgs+C0')/(1+gm*R0)].$$

Assuming that "gm*R0" is much greater than 1 the previous expression is simplified as:

$$Vout/Vin=(1+s*Cgs/gm)/[1+s*R0*(Cgs+C0')/(1+gm*R0)].$$

From this expression we can deduce the frequencies of the low frequency pole ($s_p$) and of the zero ($s_z$), which result to be:

$$sp=-gm/(Cgs+C0')\ \text{and}\ sz=-gm/Cgs$$

The frequency of the input stages IS1 and/or IS2 is determined by the frequency of the pole, and it is this pole that degrades the general performance of the operational amplifier if wider band widths are requested.

Figure 3:
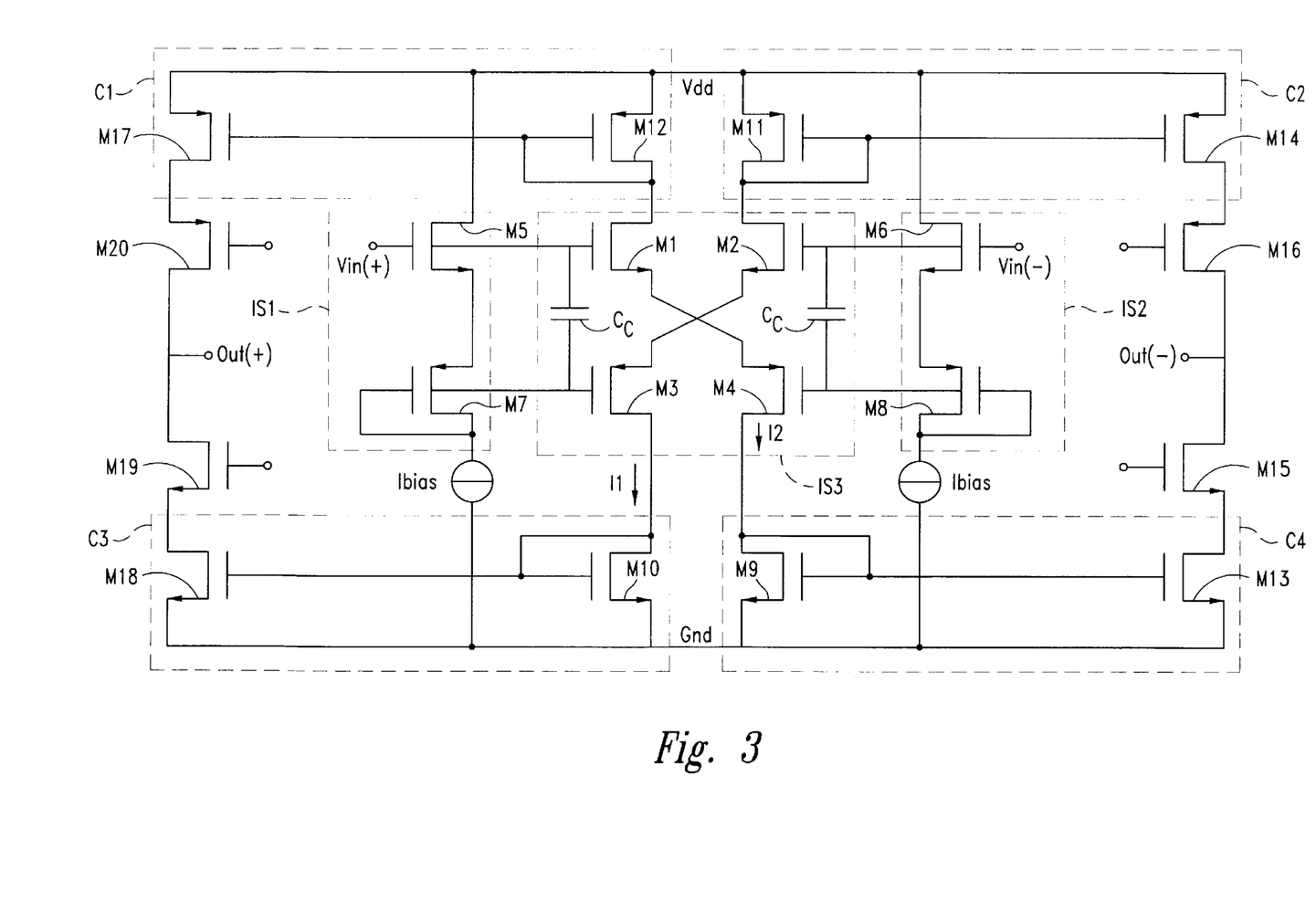
FIG. 3 shows a simplified diagram of a single-stage class AB amplifier according to the present invention.

To avoid the problem of the introduction of the doublet pole-zero by the input stages IS1, IS2, a compensation technique in frequency such as that shown in FIG. 3 must be used, in which a simplified diagram of a single-stage class AB amplifier is shown, proposed by Castello and Gray (see note on FIG. 1), which is such as to permit the widening of the band width without degrading the phase margin of the operational amplifier.

According to what is illustrated in FIG. 3, it can be noted that a compensation capacitor Cc is placed between the gate terminals of the transistors forming a voltage repeater stage 13 and the gate terminals of the transistors forming input decoupler stages IS1 and IS2.

Figure 4:
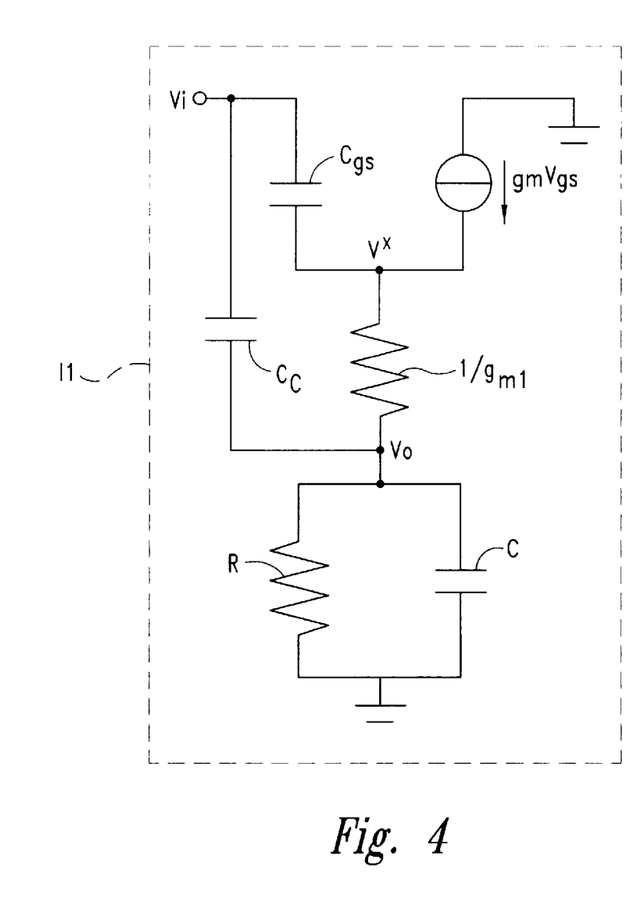
FIG. 4 shows an equivalent circuit diagram of a detail in FIG. 3.

The introduction of this compensation capacitor modifies the equivalent circuit diagram for small signals such as that shown in FIG. 4, in which it is noted that the capacitor Cc is placed in reaction to influence the position of the low frequency pole $s_p$ and of the zero $s_z$.

In fact, considering negligible the contribution of "1/gm1", the presence of the capacitor Cc moves the frequencies of the pole and of the zero as follows:

$$sp=-gm/(Cgs+C0'+Cc)\ \text{and}\ sz=-gm/(Cgs+Cc)$$

Figure 5:
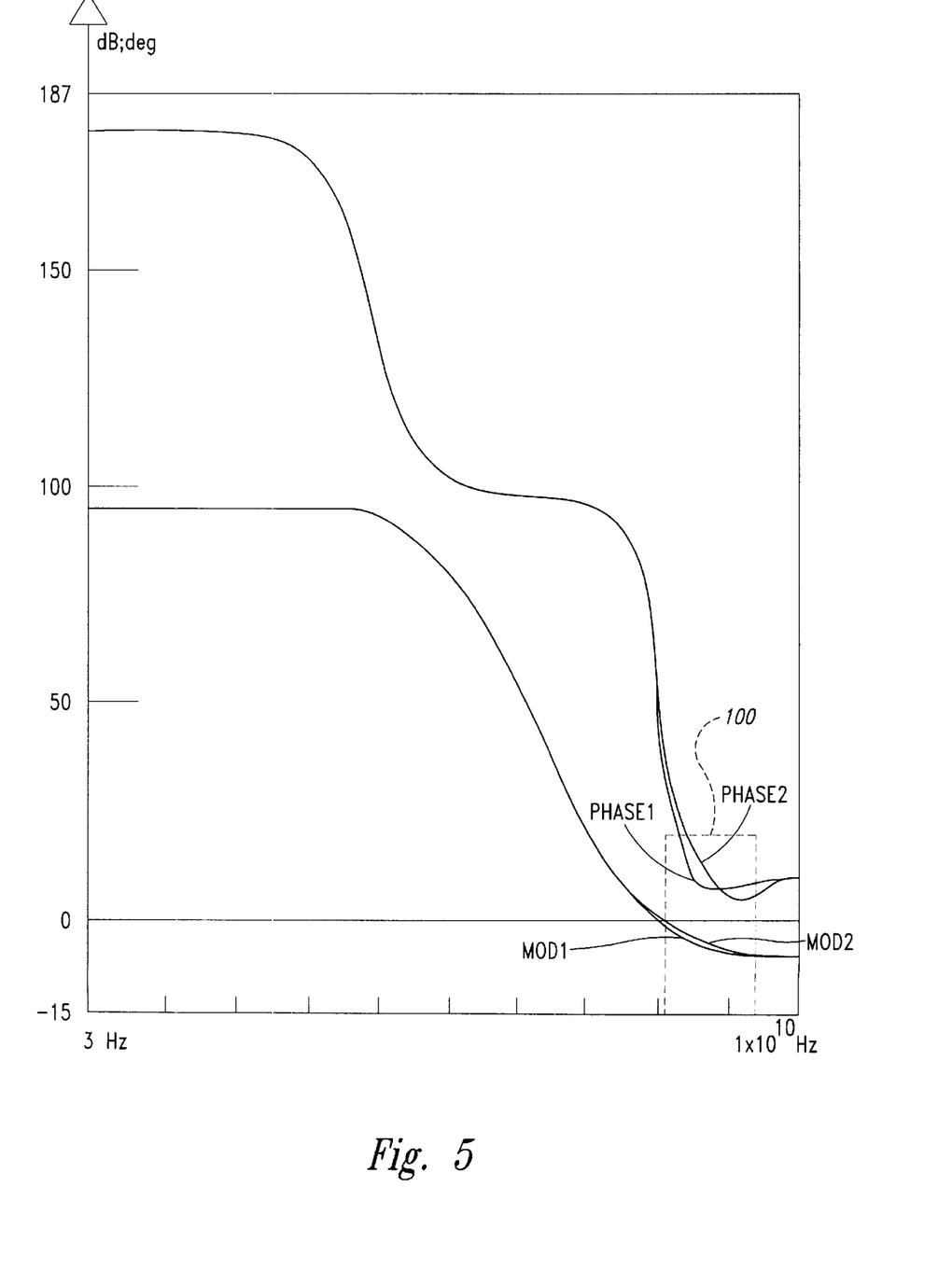
FIG. 5 shows a numeric simulation of the circuit according to the present invention.
Figure 6:
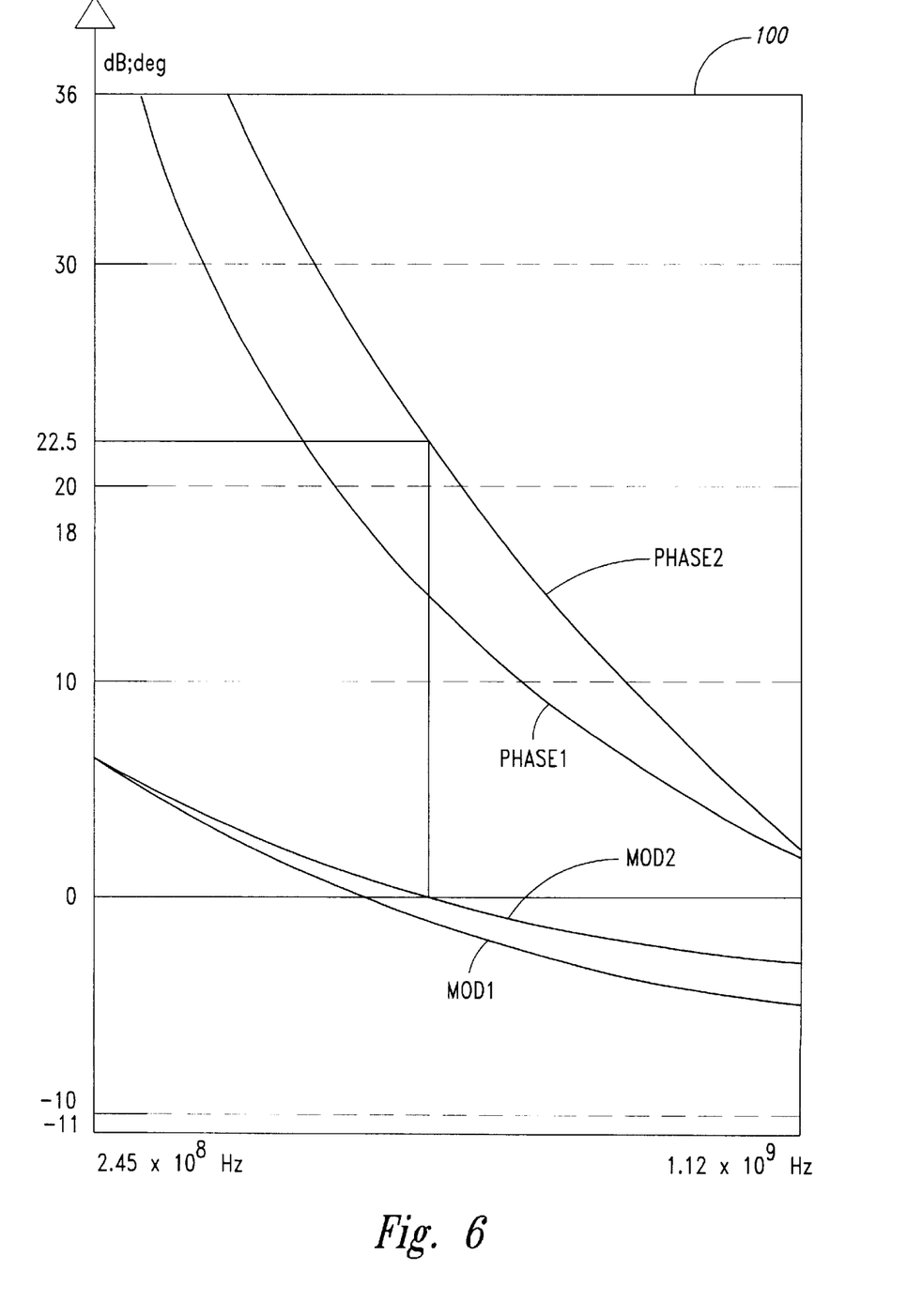
FIG. 6 shows an enlargement of a zone of the numeric simulation of FIG. 5.

If it is assumed that the capacitor Cc is much greater than C0', we obtain that the frequencies of the pole and of the zero coincide and in this manner the contribution of the doublet becomes negligible as zero and the poles annul each other making it possible to obtain an increase of the phase margin of the operational amplifier in class AB, as successively shown in the numeric simulation in FIG. 5 and FIG. 6.

According to what is shown in FIG. 5, an X-axis indicating the frequency and a Y-axis indicating both the value of the module of the transfer function, measured in db, and the value of the phase of the transfer function measured in tenths of degrees can be seen.

The representation illustrates the simulations of the circuit proposed in FIG. 1 for the values in module MOD1 and the values in PHASE1 of the transfer function and of the circuit according to the invention shown in FIG. 3 for the values in module MOD2 and for the values in PHASE2 of the transfer function, commonly known as Bode diagrams of the module and of the phase.

It is known that to have stability a circuit system must possess a phase margin exceeding 0°. The Applicant, by means of a simulation obtained by placing as characteristic parameters a band width of 400 MHz, a slew-rate time of 12 nsec, a value for the Cgs capacity equal to 300 fF, a C0' capacity equal to 70 fF and a Cc reaction capacity equal to 200 fF, found that when the graph MOD1 cuts the axis at 0 db a phase margin is obtained, derivable from the graph PHASE1, lower than 18°, as illustrated in detail in FIG. 6, while when the graph MOD2 of the circuit according to the invention, that is with the compensation technique, cuts the axis at 0 db a phase margin is obtained, derivable from the graph PHASE2, exceeding 22°, as illustrated in detail in FIG. 6.

The Applicant has also found with other simulations with stricter tolerances that it is possible to obtain a growth of the phase margin exceeding 10°.

The introduction of the compensation capacitor Cc therefore achieves a greater phase margin and thus greater stability of the system. In addition it permits a smaller slew-rate time with a wider band width.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A class AB single-stage operational amplifier comprising:
    first and second input decoupler stages having inputs for the operational amplifier for voltage signals, a voltage repeater stage, biasing means, and means for the generation of bias current of said input decoupler stages, and capacitive means placed between said input decoupler stages and said voltage repeater so as to eliminate a low frequency pole and increase the phase margin.

2. The operational amplifier of claim 1, wherein said capacitive means are placed between gate terminals of transistors constituting said voltage repeater and gate terminals of transistors constituting said input decoupler stages.

3. The operational amplifier of claim 2, wherein said capacitive means are of a much greater capacity in comparison to the capacitive load of said input decoupler stages.

4. The operational amplifier of claim 3, wherein the capacitive means is configured to generate an output having a low frequency pole that coincides with a low frequency zero.

5. An operational amplifier, comprising:
    a first input decoupler stage coupled between a first voltage source and a second voltage source and having inputs comprising inputs to the operational amplifier;
    a second input decoupler stage coupled between the first voltage source and the second voltage source;
    a voltage repeater stage coupled between the first input decoupler stage and the second input decoupler stage;
    a first compensation capacitor coupled in parallel between the voltage repeater stage and the first input decoupler stage; and
    a second compensation capacitor coupled in parallel between the voltage repeater stage and the second input decoupler stage.

6. The operational amplifier of claim 5, further comprising first, second, third, and fourth loads, and wherein the voltage repeater stage comprises first, second, third, and fourth MOS transistors, the first and fourth MOS transistors coupled in series between the first and fourth loads, and the second and third MOS transistors coupled in series between the second and third loads, and further wherein the first compensation capacitor has a first end coupled to a gate terminal of the first MOS transistor and a second end coupled to a gate terminal of the third MOS transistor, and the second compensation capacitor has a first end coupled to the gate terminal of the second MOS transistor and a second end coupled to the fourth MOS transistors.

7. The operational amplifier of claim 6, further comprising fifth, sixth, seventh, and eighth MOS transistors, wherein the first input decoupler stage comprises the fifth and seventh MOS transistors coupled in series between the first and third loads, and the second input decoupler stage comprises the sixth and eighth MOS transistors coupled between the second and fourth loads, and wherein the first compensation capacitor is further coupled to gate terminals of the fifth and seventh MOS transistors, and the second compensation capacitor is further coupled to gate terminals of the sixth and eighth MOS transistors.

8. The operational amplifier of claim 5 wherein the first and second compensation capacitors are configured so that the frequency of a low frequency pole and the frequency of a low frequency zero of the circuit output coincide and a phase margin is increased.

9. The operational amplifier of claim 5, wherein the capacitance of each compensation capacitor is greater than the capacitance of each corresponding input decoupling stage.

10. The operational amplifier of claim 5, wherein the capacitance of each compensation capacitor is about three times greater than the capacitance of each corresponding input decoupler stage.

11. The operational amplifier of claim 5, configured to have a small signal model comprising:
    a voltage input;
    a gate-source capacitance coupled between the voltage input and a first voltage node;
    a current source coupled between a ground reference and the first voltage node;
    a resistance coupled between the first voltage node and a voltage output;
    a parallel resistance-capacitance circle coupled between the voltage output and the ground reference; and
    a compensation capacitor coupled to the voltage input and the voltage output.

12. A fully differential operational amplifier, comprising:
    an inverting input circuit and a non-inverting input circuit coupled between a voltage source and a voltage reference;
    a voltage repeater stage coupled between the inverting input circuit and the non-inverting input circuit;

an inverting and non-inverting output circuit coupled to the voltage repeater stage;

the inverting input circuit comprising a first PMOS transistor having a gate terminal coupled to an inverting input terminal and a first NMOS transdiode transistor coupled in series to the first PMOS transistor;

the non-inverting input circuit comprising a second PMOS transistor having a gate terminal coupled to a non-inverting input terminal and a second NMOS transdiode transistor coupled in series to the second PMOS transistor;

a first compensation capacitor coupled between gate terminals of the first PMOS transistor and first NMOS transdiode transistor; and a second compensation capacitor coupled between gate terminals of the second PMOS transistor and the second NMOS transdiode transistor.

13. The amplifier of claim 12, wherein the voltage repeater stage comprises first, second, third, and fourth MOS transistors, the first and fourth MOS transistors coupled in series between a first load and fourth load, and the second and third MOS transistors coupled in series between the second and third loads, and wherein the first compensation capacitor is coupled to gate terminals of the first and third MOS transistors, and the second compensation capacitor is coupled to gate terminals of the second and fourth MOS transistors.

14. The amplifier of claim 13, configured to have a small signal model comprising:

a voltage input;

a gate-source capacitance coupled between the voltage input and the first voltage node;

a current source coupled between a ground reference and the first node;

a resistance coupled between the first voltage node and a voltage output;

a parallel resistance-capacitance circuit coupled between the voltage output and the ground reference; and a compensation capacitor coupled to the voltage input and the voltage output.

15. A method for increasing the phase margin of an operational amplifier having a first input decoupler stage coupled between a first voltage source and a second voltage source; a second input decoupler stage coupled between the first voltage source and the second voltage source; a voltage repeater stage coupled between the first input decoupler stage and the second input decoupler stage, the method comprising:

coupling a first compensation capacitor in parallel between the voltage repeater stage and the first input decoupler stage; and coupling a second compensation capacitor in parallel between the voltage repeater stage and the second input decoupler stage.

16. The method of claim 15, wherein the operational amplifier further includes first, second, third, and fourth loads, and a voltage repeater stage includes first, second, third, and fourth MOS transistors, with the first and fourth MOS transistors coupled in series between the first and fourth loads, and the second and third MOS transistors coupled in series between the second and third loads, and wherein the method comprises:

coupling the first compensation capacitor to gate terminals of the first and third MOS transistors; and coupling the second compensation capacitor to gate terminals of the second and fourth MOS transistors.

17. The method of claim 15, wherein the operational amplifier includes fifth, sixth, seventh, and eighth input stage MOS transistors, the first input decoupling stage having the fifth and seventh MOS transistors coupled in series between the first and third loads, the second input decoupling stage including the sixth and eighth MOS transistors coupled in series between the second and fourth loads, and wherein the method comprises:

coupling the first compensation capacitor to gate terminals of the fifth and seventh MOS transistors; and coupling the second compensation capacitor to gate terminals of the sixth and eighth MOS transistors.

18. The method of claim 15, comprising:

configuring the first and second compensation capacitors so that the frequency of a low frequency pole and the frequency of a low frequency zero of the circuit coincide and the phase margin is increased.

19. The method of claim 14, comprising:

configuring the capacitance of the first and second compensation capacitors to be greater than a capacitance of each corresponding input decoupler stage.

20. A class AB single-stage operational amplifier, comprising:

input decoupler stages for voltage signals that are formed by MOS transistors, a voltage repeater stage formed by MOS transistors, a common gate terminal of at least one MOS transistor of the input decoupler stages and of at least one MOS transistor of the voltage repeater stage forming the input terminals of the class AB single-stage operational amplifier, biasing means, and means for the generation of bias current of the input decoupler stages, and further comprising capacitive means connected to the input terminal of the class AB single-stage operational amplifier and another common gate terminal of another MOS transistor of the input decoupler stages and of another MOS transistor of the voltage repeater stage so as to generate an output having a low frequency pole that coincides with a low frequency zero.

* * * * *

UNITED STATES PATENT AND TRADEMARK OFFICE
CERTIFICATE OF CORRECTION

PATENT NO. : 6,486,736 B2
DATED : November 26, 2002
INVENTOR(S) : Paolo Cusinato et al.

It is certified that error appears in the above-identified patent and that said Letters Patent is hereby corrected as shown below:

<u>Title page,</u>
Item [54], the title should read as -- CLASS AB SINGLE-STAGE ADVANCED OPERATIONAL AMPLIFIER --.

Signed and Sealed this

Twenty-ninth Day of April, 2003

JAMES E. ROGAN
*Director of the United States Patent and Trademark Office*